United States Patent
Kida et al.

(10) Patent No.: US 12,424,421 B2
(45) Date of Patent: Sep. 23, 2025

(54) APPARATUS AND METHOD FOR CONTROLLING A SUBSTRATE TEMPERATURE

(71) Applicant: NHK SPRING CO., LTD., Yokohama (JP)

(72) Inventors: Naoya Kida, Yokohama (JP); Arata Tatsumi, Yokohama (JP); Kenji Sekiya, Yokohama (JP); Naoya Aikawa, Yokohama (JP); Masaya Takanashi, Yokohama (JP)

(73) Assignee: NHK SPRING CO., LTD., Yokohama (JP)

( * ) Notice: Subject to any disclaimer, the term of this patent is extended or adjusted under 35 U.S.C. 154(b) by 904 days.

(21) Appl. No.: 17/592,766

(22) Filed: Feb. 4, 2022

(65) Prior Publication Data
US 2022/0157579 A1 May 19, 2022

Related U.S. Application Data

(63) Continuation of application No. PCT/JP2020/028804, filed on Jul. 28, 2020.

(30) Foreign Application Priority Data

Aug. 5, 2019 (JP) ................. 2019-143756

(51) Int. Cl.
*H01J 37/32* (2006.01)
*C23C 14/24* (2006.01)
(Continued)

(52) U.S. Cl.
CPC ........ *H01J 37/32724* (2013.01); *C23C 14/24* (2013.01); *C23C 14/34* (2013.01);
(Continued)

(58) Field of Classification Search
CPC .......... H01J 37/32724; H01J 2237/334; H05B 1/0233; H05B 3/283; H01L 21/6833;
(Continued)

(56) References Cited

U.S. PATENT DOCUMENTS 9,202,728 B2   12/2015  Hara et al.
2002/0017916 A1*  2/2002  Costello ............ H01L 21/67109
                                                          324/750.09
(Continued)

FOREIGN PATENT DOCUMENTS

CN   1907897 A    2/2007
CN   101504928 A  8/2009
(Continued)

OTHER PUBLICATIONS

Office Action issued on Sep. 27, 2024, for corresponding Chinese Patent Application No. 202080049779.X, along with an English machine translation (11 pages).

(Continued)

*Primary Examiner* — Phuong T Nguyen
(74) *Attorney, Agent, or Firm* — HAUPTMAN HAM, LLP

(57) ABSTRACT

A stage includes a shaft, a first supporting plate over the shaft, a heater arranged in a trench formed in the first supporting plate, and a gas-supplying tube arranged in the shaft and configured to blow a gas to the first supporting plate. The first supporting plate may have a disk shape, and a cross section of the gas-supplying tube parallel to a surface of the first supporting plate may overlap a center of the disk shape. The first supporting plate may be configured to block the gas so that the gas is not released to a chamber in which the stage is arranged.

12 Claims, 12 Drawing Sheets

(51) Int. Cl.

| | | |
|---|---|---|
| *C23C 14/34* | (2006.01) | |
| *C23C 14/50* | (2006.01) | |
| *C23C 16/44* | (2006.01) | |
| *C23C 16/458* | (2006.01) | |
| *C23C 16/46* | (2006.01) | |
| *H05B 1/02* | (2006.01) | |
| *H05B 3/28* | (2006.01) | |
| *H01L 21/683* | (2006.01) | |

(52) U.S. Cl.
CPC .......... *C23C 14/50* (2013.01); *C23C 16/4412* (2013.01); *C23C 16/4586* (2013.01); *C23C 16/46* (2013.01); *H05B 1/0233* (2013.01); *H05B 3/283* (2013.01); *H01J 2237/334* (2013.01); *H01L 21/6833* (2013.01)

(58) Field of Classification Search
CPC ......... C23C 14/24; C23C 14/34; C23C 14/50; C23C 16/4412; C23C 16/4586; C23C 16/46
USPC ....................................................... 219/444.1
See application file for complete search history.

(56) References Cited

U.S. PATENT DOCUMENTS

| | | |
|---|---|---|
| 2006/0130764 A1 | 6/2006 | Quan |
| 2007/0029642 A1 | 2/2007 | Inagawa et al. |
| 2008/0035306 A1 | 2/2008 | White et al. |
| 2008/0226838 A1 | 9/2008 | Nishimura et al. |
| 2009/0194264 A1 | 8/2009 | Sasaki |
| 2011/0092075 A1 | 4/2011 | Suzuki et al. |
| 2014/0312378 A1 | 10/2014 | Hsue |
| 2015/0056787 A1 | 2/2015 | Brenninger |
| 2015/0179485 A1 | 6/2015 | Hiroki |
| 2015/0376783 A1 | 12/2015 | Hanamachi et al. |
| 2016/0087177 A1 | 3/2016 | Schwarz et al. |
| 2018/0366303 A1 | 12/2018 | Tsuda et al. |
| 2019/0228953 A1 | 7/2019 | Tachikawa et al. |
| 2020/0303594 A1 | 9/2020 | Sorg et al. |

FOREIGN PATENT DOCUMENTS

| | | | |
|---|---|---|---|
| CN | 201436515 U | 4/2010 | |
| JP | 2004-63813 A | 2/2004 | |
| JP | 2008-231513 A | 10/2008 | |
| JP | 2009-49061 A | 3/2009 | |
| JP | 2009049061 A * | 3/2009 | ............. C23C 16/46 |
| JP | 2011253691 A * | 12/2011 | ............. H01L 21/02 |
| JP | 2014-56370 A | 3/2014 | |
| JP | 2014-175491 A | 9/2014 | |
| JP | 2015-144242 A | 8/2015 | |
| JP | 2018-56333 A | 4/2018 | |
| KR | 10-2006-0069251 A | 6/2006 | |
| KR | 10-1603031 B1 | 3/2016 | |
| KR | 10-2019-0052804 A | 5/2019 | |
| WO | 2019/093657 A1 | 5/2019 | |

OTHER PUBLICATIONS

Office Action issued on Nov. 7, 2023, for corresponding Korean Patent Application No. 10-2022-7005051, along with an English machine translation (8 pages).
The Extended European Search Report issued on Jul. 4, 2023 for corresponding European Patent Application No. 20850947.1 (8 pages).
International Search Report dated Oct. 20, 2020 for corresponding International Patent Application No. PCT/JP2020/028804.
Written Opinion dated Oct. 20, 2020 for corresponding International Patent Application No. PCT/JP2020/028804.
Japanese Office Action dated Jan. 12, 2021 for corresponding Japanese Patent Application No. 2019-143756.
Taiwanese Office Action dated Sep. 9, 2021 for corresponding Taiwanese Patent Application No. 109126414.
English translation of Written Opinion of the International Searching Authority issued on Oct. 20, 2020 for corresponding International Patent Application No. PCT/JP2020/028804.
Office Action issued on Jul. 23, 2024 for corresponding Korean Patent Application No. 10-2022-7005051, along with an English machine translation (10 pages).
Meizhen Gao et al., "LED display drive BN5279(A) and its application of the series port", Foreign Electronic Elements, Issue 6, Jun. 25, 2005, pp. 69-72, along with an English Abstract.
Jongbok Baek et al., "AC LED Driver with High Power Factor and Balanced Brightness for Segmented LED strings", Proceedings of the IECON 2016—42nd Annual Conference of the IEEE Industrial Electronics Society, May 24, 2017, pp. 31-35.
Office Action dated Feb. 15, 2025 for corresponding Chinese Patent Application No. 202080049779.X, along with an English translation (14 pages).
Notice of Final Rejection issued on May 21, 2025 for corresponding Korean Patent Application No. 10-2022-7005051, along with an English machine translation (7 pages).
Office Action issued on Jul. 31, 2025, for corresponding Chinese Patent Application No. 202080049779.X., along with an English machine translation (16 pages).

* cited by examiner

ΔT = 9.8 °C

ΔT = 2.6 °C

APPARATUS AND METHOD FOR CONTROLLING A SUBSTRATE TEMPERATURE

CROSS REFERENCE TO RELATED APPLICATIONS

This application is based on and claims the benefit of priority from the prior Japanese Patent Application No. 2019-143756, filed on Aug. 5, 2019, and the PCT Application No. PCT/JP2020/028804, filed on Jul. 28, 2020, the entire contents of which are incorporated herein by reference.

BACKGROUND OF THE INVENTION

An embodiment of the present invention relates to a stage for supporting a substrate, a film-forming apparatus or a film-processing apparatus including the stage, and a method for controlling the temperature of a substrate.

DESCRIPTION OF THE RELATED ART

A semiconductor device is installed in almost all electronic devices and has a significant role for their functions. A semiconductor device utilizes the semiconductor properties of silicon or the like and is prepared by stacking a variety of patterned semiconductor films, insulating films, and conducting films over a substrate. These films are formed by utilizing an evaporation method, a sputtering method, a chemical vapor deposition (CVD) method, or a chemical reaction of the substrate and are processed (patterned) with a photolithography process.

The properties of these films are strongly influenced by the conditions when the films are formed or patterned. One of the conditions is the temperature of a substrate. In most cases, a supporting stage (hereinafter, referred to as a stage) for supporting a substrate is controlled so that the temperature thereof is as uniform as possible in order to maintain a uniform temperature throughout the substrate. The temperature control of the stage is carried out by heating a heater provided in the stage and simultaneously flowing a coolant in a channel for a coolant formed in the stage (see, Japanese Patent Application Publications No. 2018-056333 and 2014-175491).

BRIEF SUMMARY OF THE INVENTION

An object of an embodiment of the present invention is to provide a stage for precisely controlling a temperature of a substrate. Alternatively, an object of an embodiment of the present invention is to provide a film-forming apparatus or a film-processing apparatus including the stage. Alternatively, an object of an embodiment of the present invention is to provide a method for precisely controlling the temperature of a substrate.

An embodiment of the present invention is a stage. The stage includes a shaft, a first supporting plate over the shaft, a heater arranged in a trench formed in the first supporting plate, and a gas-supplying tube arranged in the shaft and configured to blow a gas to the first supporting plate An embodiment of the present invention is a method for controlling a temperature of a substrate. The method includes arranging a substrate over a stage comprising a first plate and a shaft under the first supporting plate, heating the first stage with a heater arranged in a channel formed in the first supporting plate, and blowing a gas to the first supporting plate from a gas-supplying tube arranged in the shaft.

DESCRIPTION OF EMBODIMENTS

Figure 1:
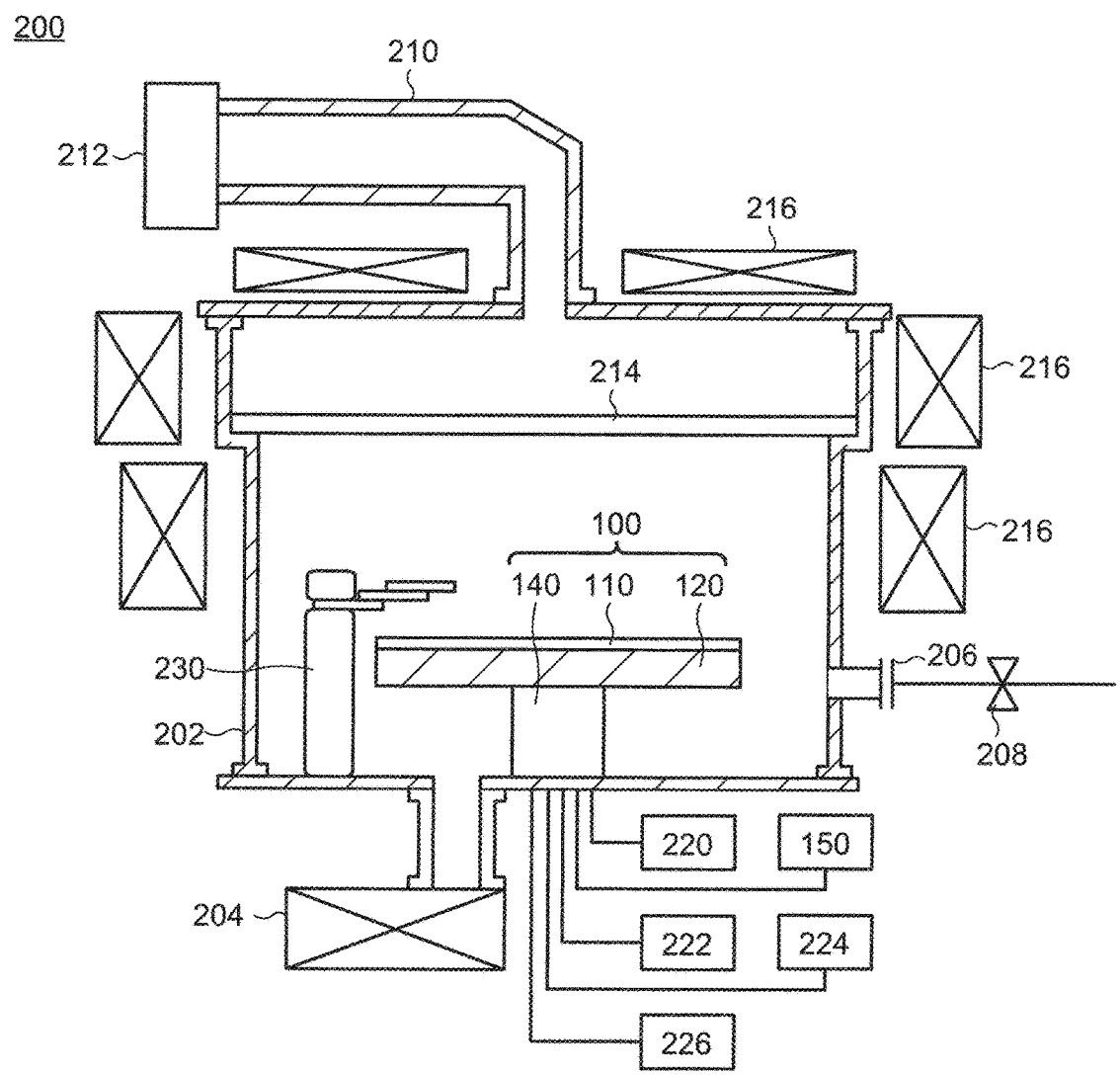
FIG. 1 is a schematic cross-sectional view of a film-processing apparatus according to an embodiment of the present invention.

Hereinafter, each embodiment of the present invention is explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the specification and drawings, the same reference numeral is used when the same or similar structures are collectively expressed, while a small letter is further added thereto when these structures are distinctively expressed. When a plurality of portions in a single structure is distinctively expressed, the same reference number is used, and a hyphen and a natural number are further added.

First Embodiment

In the present embodiment, a stage 100 according to an embodiment of the present invention and an etching apparatus 200 which is a film-processing apparatus equipped with the stage 100 are explained.

1. Etching Apparatus

In FIG. 1, a schematic cross-sectional view of the etching apparatus 200 for performing dry etching on a variety of films is shown as an example of a film-processing apparatus. The etching apparatus 200 includes a chamber 202 supplying a space for performing etching on films of a conductor, an insulator, a semiconductor, and the like formed over a substrate.

An exhaust device 204 is connected to the chamber 202 by which the inside of the chamber 202 can be set under a reduced pressure atmosphere. The chamber 202 is further equipped with an inlet tube 206 for introducing a reaction gas, and the reaction gas for etching is supplied to the chamber 202 through a valve 208. A fluorine-containing organic compound such as tetrafluorocarbon ($CF_4$), octafluorocyclobutane ($c$-$C_4F_8$), decafluorocyclopentane ($c$-$C_5F_{10}$), and hexafluorobutadiene ($C_4F_6$) is represented as the reaction gas for example.

A microwave source 212 may be disposed at an upper portion of the chamber 202 through a waveguide tube 210. The microwave source 212 has an antenna or the like for supplying microwaves and outputs high-frequency microwaves such as a microwave of 2.45 GHz and a radio wave (RF) of 13.56 MHz. The microwaves generated by the microwave source 212 are transmitted to an upper portion of the chamber 202 by the waveguide tube 210 and introduced into the chamber 202 through a window 214 including quartz, ceramics, or the like. The reaction gas is converted to a plasma with the microwaves, and the films are etched with electrons, ions, and radicals included in the plasma.

The stage 100 according to an embodiment of the present invention is disposed at a lower portion of the chamber 202 for arranging a substrate. The substrate which is not illustrated is arranged over the stage 100. A power source 220 is connected to the stage 100, and high-frequency electric power is provided to the stage 100 so that an electric field generated by the microwaves is formed on a surface of the stage 100 in a direction perpendicular to a substrate surface. Magnets 216 may be further disposed at an upper portion and on a side surface of the chamber 202. The magnets 216 may be a permanent magnet or an electromagnet having an electromagnetic coil. A magnetic field component parallel to the surfaces of the stage 100 and the substrate is formed by the magnets 216, and electrons in the plasma receive a Lorentz force to resonate so that they become bound to the surfaces of the stage 100 and the substrate. Accordingly, a high-density plasma can be generated on the substrate surface.

When the temperature of the substrate is controlled in the etching apparatus 200, a gas (also referred to as a gas for cooling) is supplied for cooling a center portion of the stage 100 while using a sheath heater (described below) 124 arranged in the stage 100 as described below. Hence, the etching apparatus 200 is equipped with a heater power source 222 for controlling the sheath heater 124 and a gas-supplying device 150. Although not illustrated, a cooling device may be connected to the gas-supplying device 150 for cooling the gas for cooling supplied from the gas-supplying device 150. A power source 244 for an electrostatic chuck for fixing the substrate to the stage 100, a temperature controller 226 for performing temperature control of a fluid circulated in the stage 100, and a rotation-controlling device (not illustrated) for rotating the stage 100 may be further connected to the stage 100 as optional components. A mechanism for transporting the substrate may be arranged in the chamber 202. There is no limitation to the mechanism, and a transportation robot 230 equipped with a robot arm may be arranged as shown in FIG. 1.

1-2. Stage

Figure 2A:
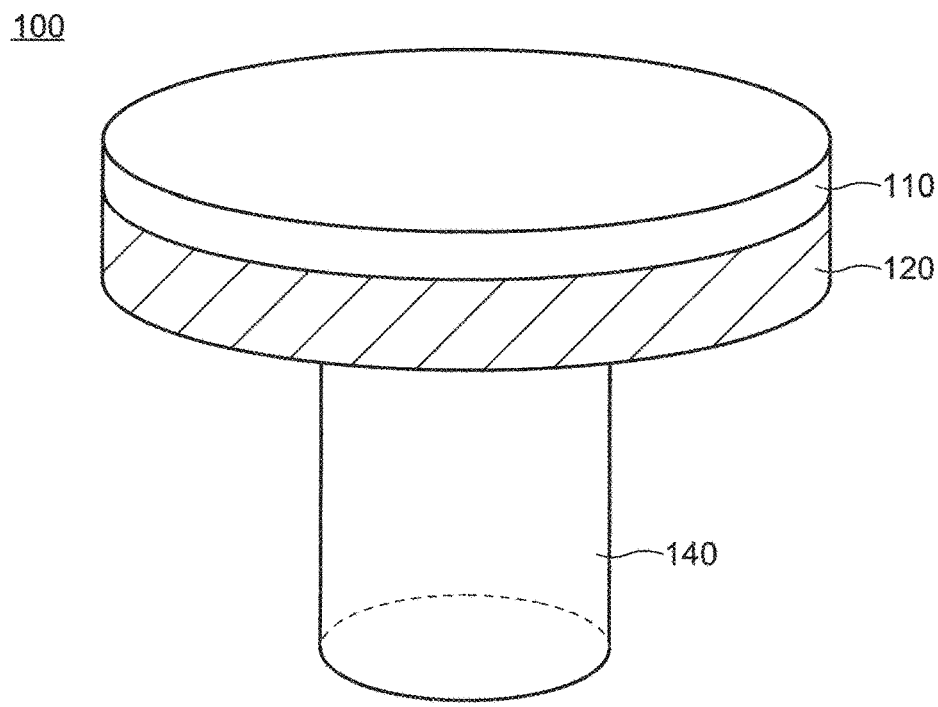
FIG. 2A is a schematic perspective view of a stage according to an embodiment of the present invention.

A schematic perspective view of the stage 100 according to an embodiment is shown in FIG. 2A. As shown in FIG. 2A, the stage 100 has a shaft 140 and includes, over the shaft 140, a first supporting plate 120 supported by the shaft 140 and a second supporting plate 110 over the first supporting plate 120 as a fundamental structure. In FIG. 1A, the first supporting plate 120 and the second supporting plate 110 each have a disk shape with a circular top surface. However, the shapes thereof are not limited and may be a shape matching the shape of the employed substrate. For example, the first supporting plate 120 and the second supporting plate 110 each may have a rectangular parallelepiped shape with a rectangular top surface.

Figure 2B:
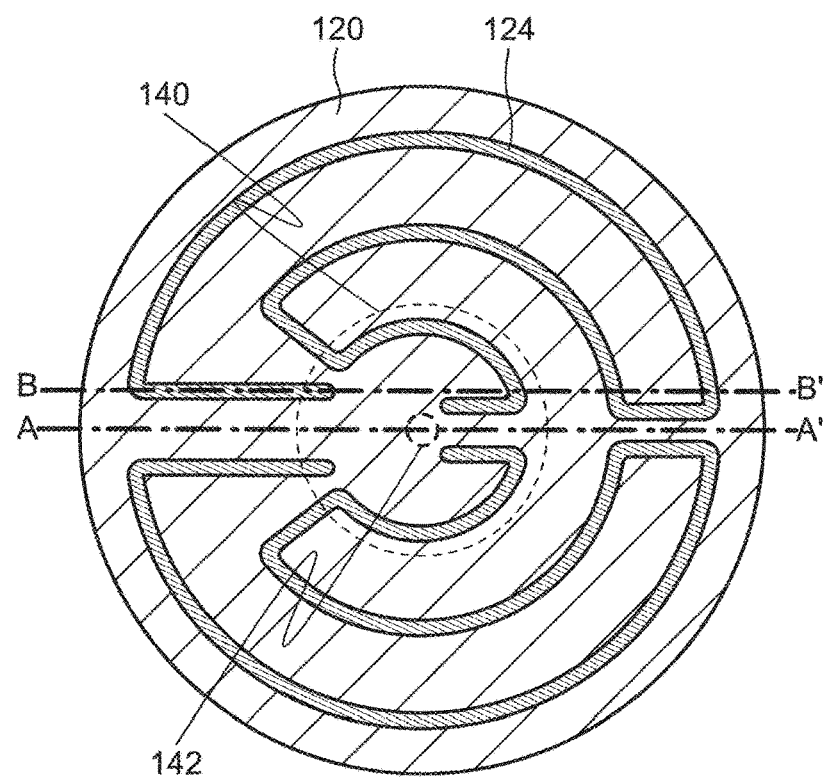
FIG. 2B is a schematic top view of a stage according to an embodiment of the present invention.

A schematic top view of the stage 100 is shown in FIG. 2B. In FIG. 2B, the second supporting substrate 110 is not illustrated. One or a plurality of trenches 122 (see FIG. 3B) is formed along the top surface thereof, and a sheath heater 124 is arranged in each of the trenches 122. A heating wire electrically connected to the heater power source 222 (see FIG. 1) is provided in the sheath heater 124. The sheath heaters 124 are heated by electrical power from the heater power source 222. The trenches 122 are formed so that the whole of the supporting plate 120 is uniformly heated with the sheath heaters 124. The heat of the first supporting plate 120 is transmitted to the second supporting plate 112, and the substrate arranged over the second supporting plate 110 is heated with this heat. Although not illustrated, trenches may also be formed in the second supporting plate 110, and the sheath heaters 124 may be accommodated in the trenches 122 of the first supporting plate 120 and the trenches of the second supporting plate 110. Alternatively, trenches may be formed in the second supporting plate 110 without forming any trench 122 in the first supporting plate 120 so that the sheath heaters 124 are arranged in the trenches of the second supporting plate 110.

The first supporting plate 120 and the second supporting plate 110 each contain a metal selected from metals having a thermal conductivity equal to or higher than 10 W/mK and equal to or lower than 430 W/mk. The thermal energy generated by the sheath heaters 124 can be efficiently received by using a metal with a high thermal conductivity. In addition, the metal is preferred to have a thermal expansion coefficient equal to or higher than $3 \times 10^{-6}$/K and equal to or lower than $25 \times 10^{-6}$/K. As a specific metal meeting such characteristics, a metal such as titanium, aluminum, and stainless steel is represented. The metal included in the second supporting plate 110 and the metal included in the first supporting plate 120 may be the same as or different from each other. When they are different from each other, the metals may be selected so that a difference in thermal expansion coefficient between the metals included in the first supporting plate 120 and the second supporting plate 110 is equal to or lower than 250'10⁻⁶/K. This configuration suppresses deformation caused by the thermal expansion, allowing the formation of the stage 100 with high reliability.

The second supporting plate 110 and the first supporting plate 120 are bonded to each other. The bonding of the first supporting plate 120 and the second supporting plate 110 can be carried out by welding, screw bonding, or brazing. An alloy containing silver, copper, and zinc, an alloy containing copper and zinc, a copper containing a small amount of phosphorus, aluminum or an alloy thereof, an alloy containing titanium, copper, and nickel, an alloy containing titanium, zirconium, and copper, an alloy containing titanium, zirconium, copper, and nickel, and the like are represented as a braze used in brazing.

Figure 3A:
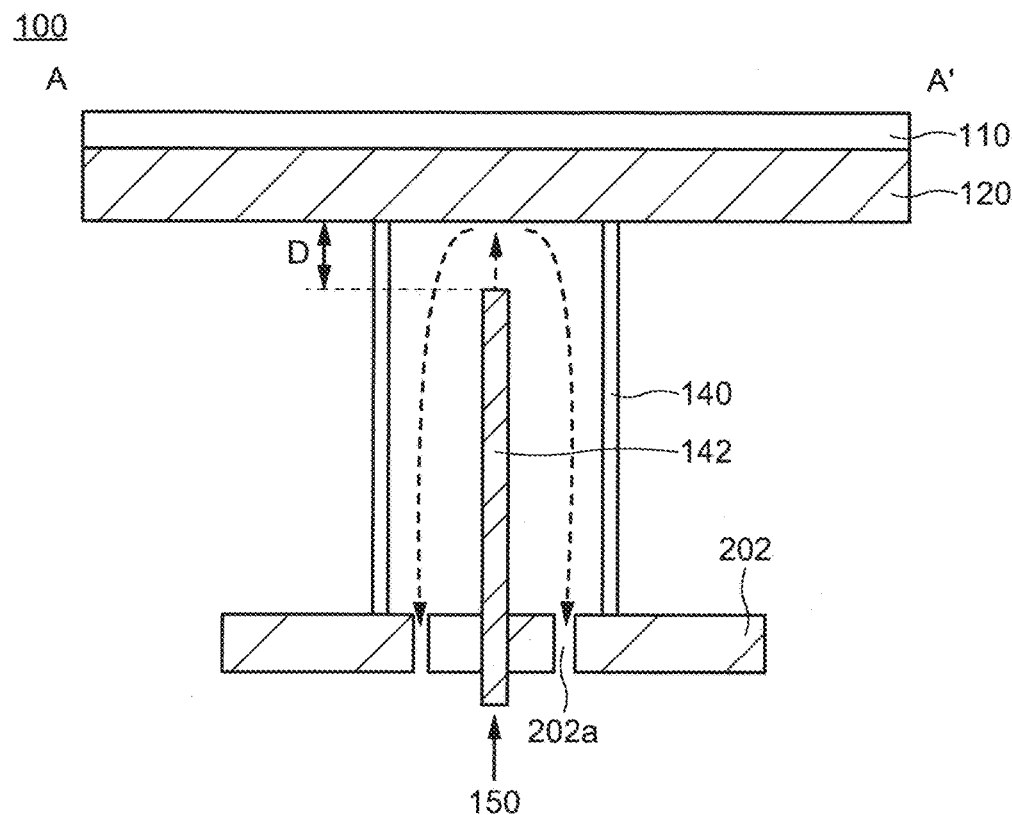
FIG. 3A is a schematic cross-sectional view of a stage according to an embodiment of the present invention.
Figure 3B:
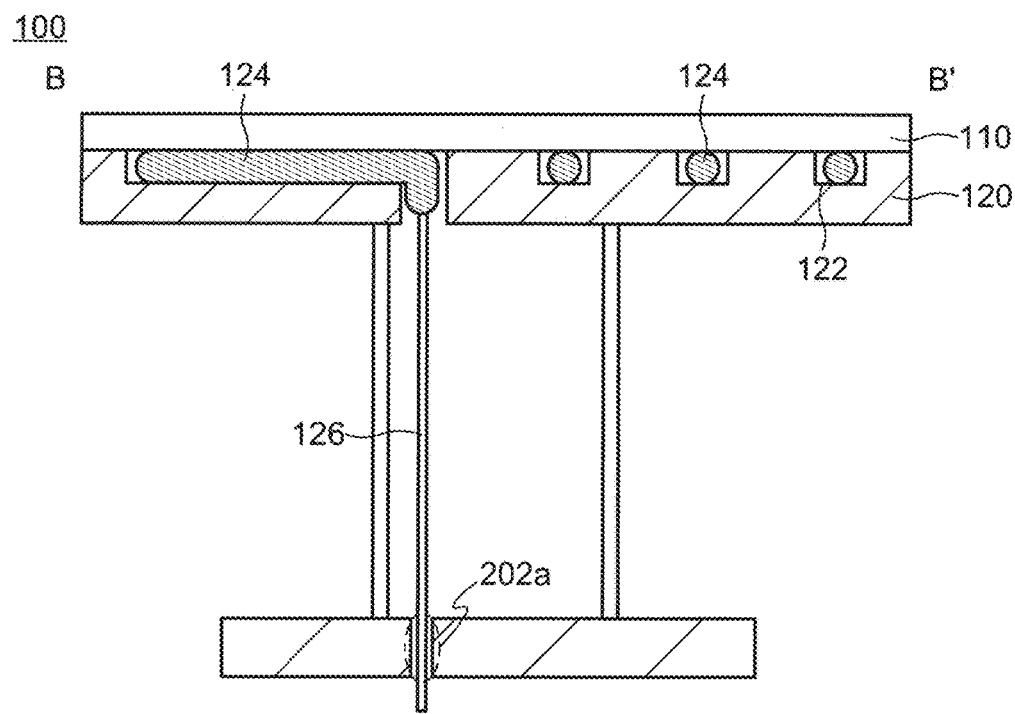
FIG. 3B is a schematic top view of a stage according to an embodiment of the present invention.

Schematic views of cross sections along chain lines A-A' and B-B' in FIG. 2B are respectively shown in FIG. 3A and FIG. 3B. As demonstrated in FIG. 3A, a gas-supplying tube 142 connected to the gas-supplying device 150 is provided in the shaft 140. The gas-supplying tube 142 has a hollow structure and is configured so that the gas for cooling supplied from the gas-supplying device 150 flows in the gas-supplying tube 142 and is then supplied in a direction toward the first supporting plate 120. There is no limitation to a material included in the gas-supplying tube 142, and a metal such as iron, aluminum, copper, an alloy such as stainless steel and brass, or a vinyl polymer such as poly (vinyl chloride) and polyethylene may be used as the material. A fluorine-containing polymer such as polytetrafluoroethylene may be used as a vinyl polymer.

The gas for cooling supplied through the gas-supplying tube 142 is used to cool the center portion of the first supporting plate 120 so as to allow the center portion to have a lower temperature than the circumference portion. The gas-supplying tube 142 is preferred to be disposed so that a center axis thereof passes through the center of the first supporting plate 120. Hence, when the plane shape of the first supporting plate 120 is a circle (that is, when the first supporting plate 120 has a disk shape), it is preferred to provide the gas-supplying tube 142 so that the center axis thereof passes through the center of the circle. However, the arrangement of the gas-supplying tube 142 may not be strictly controlled in this way, and the gas-supplying tube 142 may be arranged so that the center of the first supporting plate 120 and a vicinity thereof can be cooled. Therefore, the gas-supplying tube 142 may be arranged so that a cross section of the gas-supplying tube 142 parallel to a top surface of the first supporting plate 120 overlaps the center of the first supporting plate 120, for example.

A distance D (see FIG. 3A) between a tip of the gas-supplying tube 142 and the first supporting plate 120 may be appropriately set in view of the size of the first supporting plate 120, the amount of the supplied gas for cooling, the temperature of the gas for cooling, and the like and may be selected from a range equal to or more than 1 mm and equal to or less than 30 mm, equal to or more than 5 mm and equal to or less than 20 mm, or equal to or more than 5 mm and equal to or less than 15 mm. It is possible to selectively cool the center portion of the first supporting plate 120 while preventing the stream of the gas for cooling from widely diffusing before contacting the first supporting plate 120 by setting the distance D within the aforementioned range. Simultaneously, generation of a large temperature gradient can be avoided around the center portion.

It is preferred that the gas for cooling not be released into the chamber 202. This is because the gas composition and pressure in the chamber 202 vary due to the gas for cooling. Hence, the shaft 140 and the first supporting plate 120 are preferably configured so that the gas for cooling does not leak into the chamber 202. For example, no through hole is provided to the first supporting plate 120 at least in a region overlapping the shaft 140 to block the gas for cooling. Furthermore, the etching apparatus 200 may be configured to exhaust the gas for cooling by providing one or a plurality of through holes 202a to the chamber 202 in the region overlapping the shaft 140 as shown in FIG. 3A. With this structure, the gas for cooling supplied in a direction toward the first supporting plate 120 comes in contact with the center of the first supporting plate 120 and then changes in direction in the shaft 140 so as to be exhausted outside the chamber 202 as shown by the dotted line in FIG. 3A.

Air, nitrogen, argon, a mixed gas thereof, and the like can be used as the gas for cooling, and the temperature thereof may be room temperature or may be appropriately selected from a range equal to or higher than −20° C. or equal to or lower than 30° C., 0° C. or equal to or lower than 25° C., or 10° C. or equal to or lower than 25° C. When a temperature other than room temperature is selected, the temperature of the gas for cooling may be controlled with a cooling device. A flow amount of the gas for cooling is also appropriately adjusted and may be selected from a range equal to or more than 10 L/min and equal to or less than 1000 L/min, 30 L/min and equal to or less than 500 L/min, or 30 L/min and equal to or less than 300 L/min.

As described above, the trench 122 is formed at the upper surface of the first supporting plate 120, and the sheath heater 124 is arranged along the trench 122 (FIG. 3B). There is also no limitation to the structure of the sheath heater 124, and a double-terminal type sheath heater having terminals at both terminals or a single-terminal type sheath heater having two terminals only at one terminal may be used. The heater wiring of the sheath heater 124 is connected to a wiring 126 extending in the shaft 140, is extracted to the outside through the through hole 202a provided to the chamber 202, and is connected to the heater power source 222.

Figure 4A:
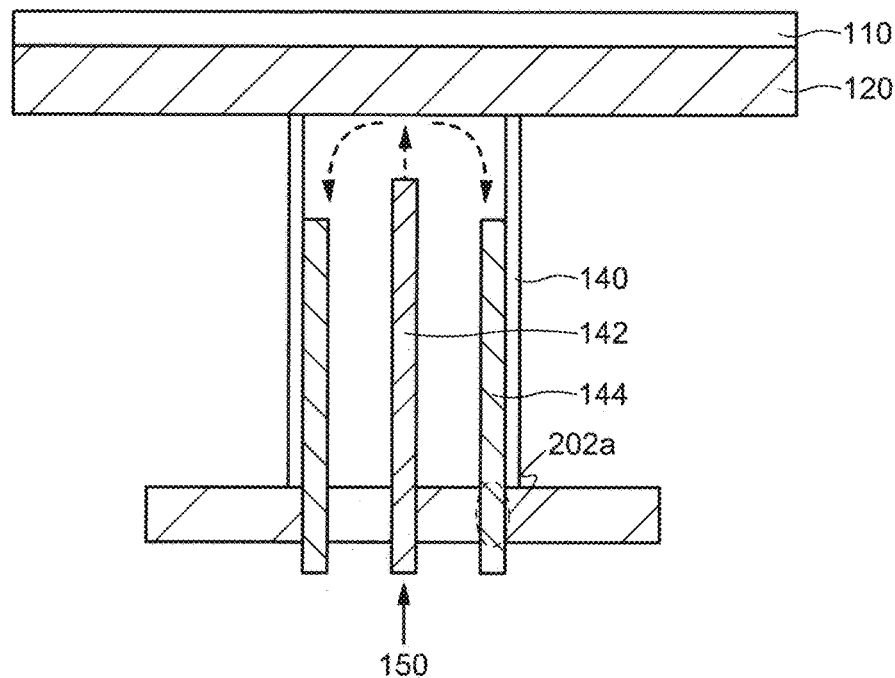
FIG. 4A is a schematic cross-sectional view of a stage according to an embodiment of the present invention.
Figure 4B:
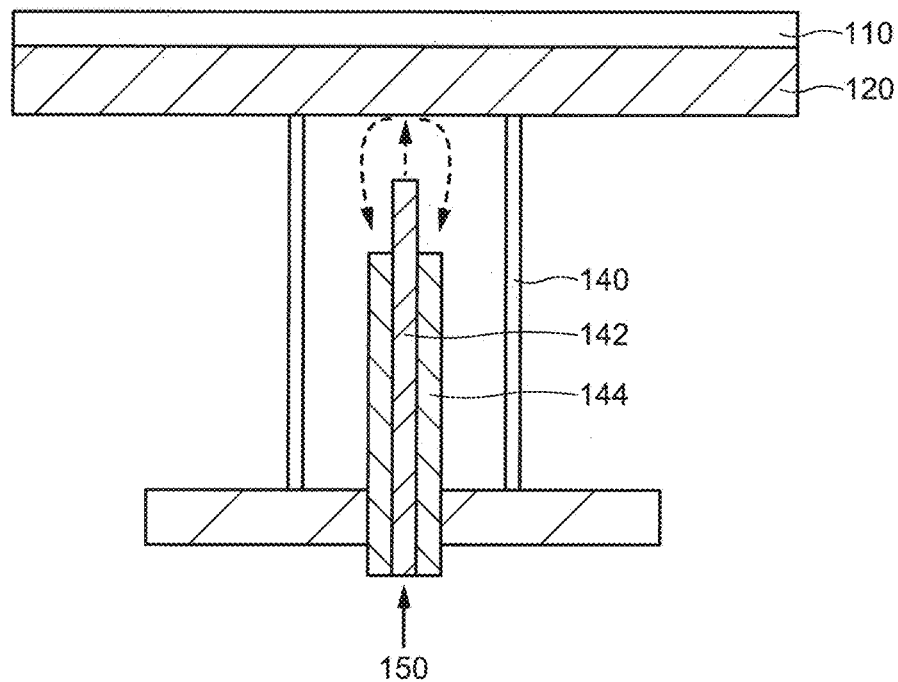
FIG. 4B is a schematic top view of a stage according to an embodiment of the present invention.

A gas-discharging tube 144 for controlling the discharge of the gas for cooling may be provided in the shaft 140. For example, one or a plurality of gas-discharging tubes 144 is inserted into the shaft 140 through the through holes 202a of the chamber 202 as shown in FIG. 4A. The position of the edge portions of the gas-discharging tubes 144 may be arbitrarily adjusted, and a distance to the first supporting plate 120 may be the same as the distance D (see FIG. 3A) or smaller or larger than the distance D. The gas-discharging tube 144 may be arranged along an inner wall of the shaft 140 or may be arranged so as to be in contact with the gas-supplying tube 142 as shown in FIG. 4B. Although not illustrated, the gas for cooling may be sucked up by connecting a gas-exhaust device to the gas-discharging tubes 144. The stream of the gas for cooling can be more precisely controlled by employing such a structure.

Figure 5A:
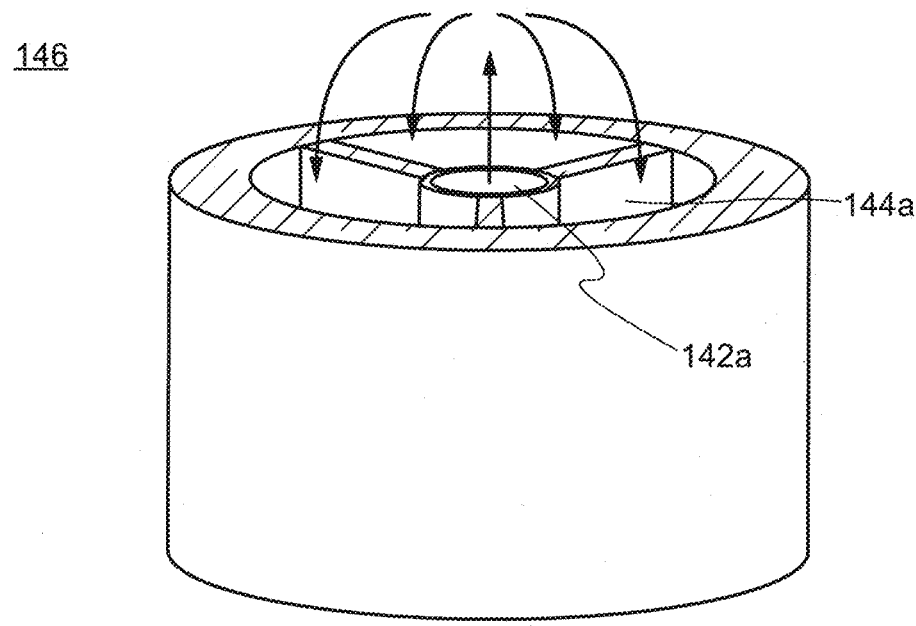
FIG. 5A is a schematic perspective view of a gas-supplying tube of a stage according to an embodiment of the present invention.
Figure 5B:
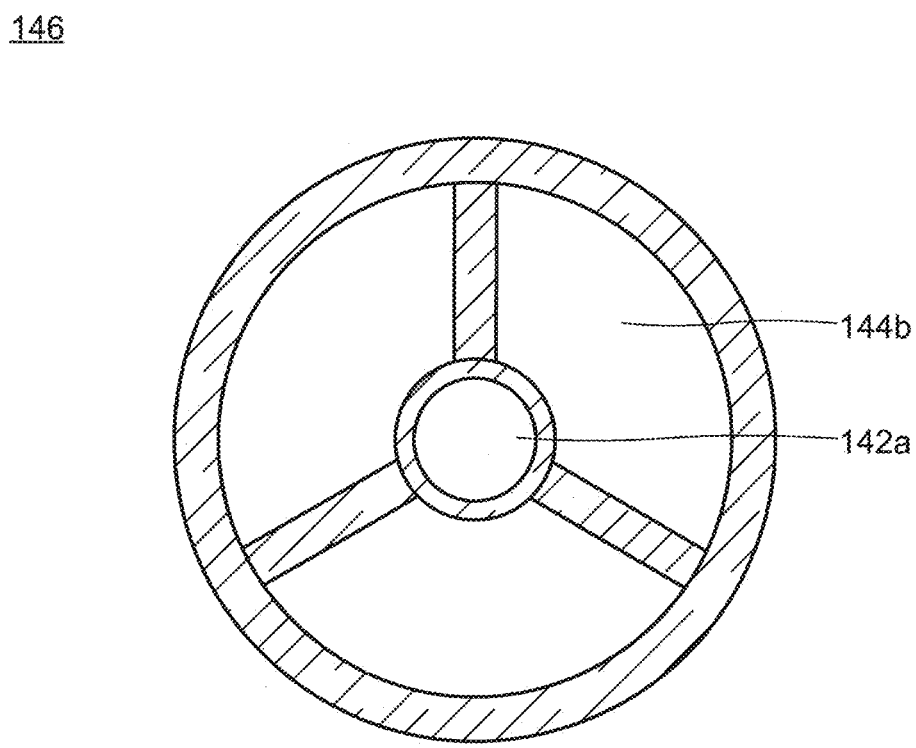
FIG. 5B is a schematic cross-sectional view of a gas-supplying tube of a stage according to an embodiment of the present invention.

Alternatively, a gas-supplying-discharging tube having an ability to simultaneously supply and discharge the gas for cooling may be used. For example, a gas-supplying-discharging tube 146 may be employed instead of the gas-supplying tube 142 and the gas-discharging tube 144, where the gas-supplying-discharging tube 146 has a gas-supplying portion 142a connected to the gas-supplying device 150 and gas-discharging portions 144a arranged to surround the gas-supplying portion 142a and integrated with the gas-supplying portion 142a as shown in FIG. 5A and FIG. 5B. In the gas-supplying-discharging tube 146, the gas-supplying portion 142a and the gas-discharging portions 144a are separated by a single partition wall. The use of the gas-supplying-discharging tube 146 allows the space in the shaft 140 to be efficiently utilized. Accordingly, the number of independently controlled sheath heaters 124 can be increased, which contributes to more precise control of the temperature of the stage 100.

Figure 6:
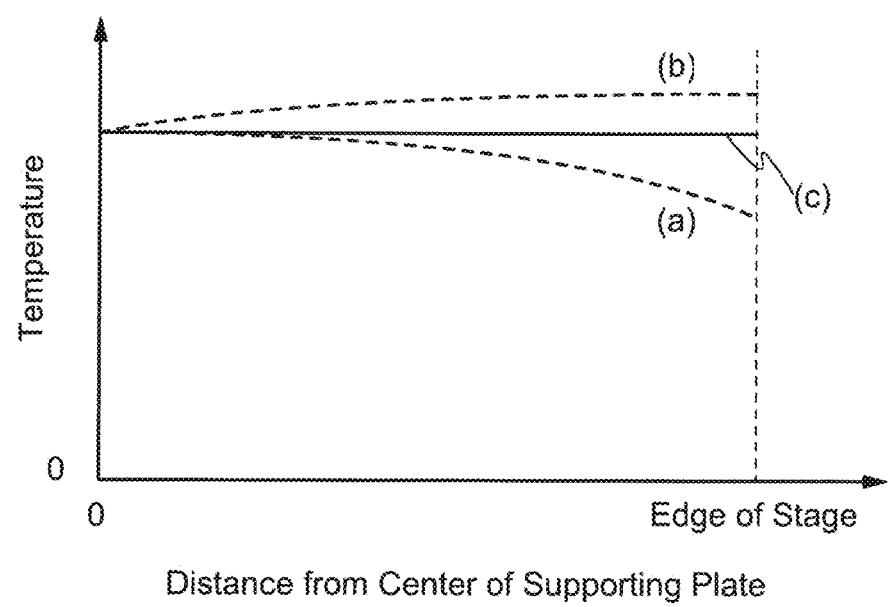
FIG. 6 is a schematic view showing a temperature distribution of a stage according to an embodiment of the present invention.

A stage arranged in the traditional film-processing apparatus or film-forming apparatus is designed so that the whole of the supporting plate has a uniform temperature in order to uniformly heat the whole of the substrate arranged over the stage. That is, the number of sheath heaters, the arrangement thereof, and the like are determined so that the supporting plate has the same temperature throughout from its center portion to the circumference portion as demonstrated by a linear line (c) in a conceptional drawing of FIG. 6. However, the heat release from the circumference portion of the stage cannot be ignored in the film-processing apparatus and the film-forming apparatus, and the heat dissipates to the chamber 202 and a mechanism for transporting the substrate such as the transportation robot 230 described in FIG. 1 as well as pins for moving the substrate in a vertical direction and protection tools (not illustrated) arranged close to the stage. As a result, even if the stage is designed so as to provide an ideal temperature profile represented by the linear line (c) in the case where no heat dissipation occurs, the temperature of the circumference portion of the stage decreases (dotted line (a)) to cause a temperature distribution in the substrate.

In contrast, the gas for cooling is supplied to the center portion of the first supporting plate 120 while heating the second supporting plate 110 through the first supporting plate 120 using the sheath heaters 124 in the stage 100 according to an embodiment of the present invention. As a result, the temperatures of the first supporting plate 120 and the second supporting plate 110 can be controlled so that the temperature of the center portion is lower than the temperature of the circumference portion as shown by the dotted line (b). Production of such a temperature profile establishes a balance with the heat dissipation from the circumference portions of the first supporting plate 120 and the second supporting plate 110, thereby realizing the ideal temperature profile represented by the linear line (c) or a similar temperature profile. Accordingly, it is possible to process or from a film over a substrate while maintaining a uniform temperature throughout the substrate.

1-3. Modified Example

Figure 7A:
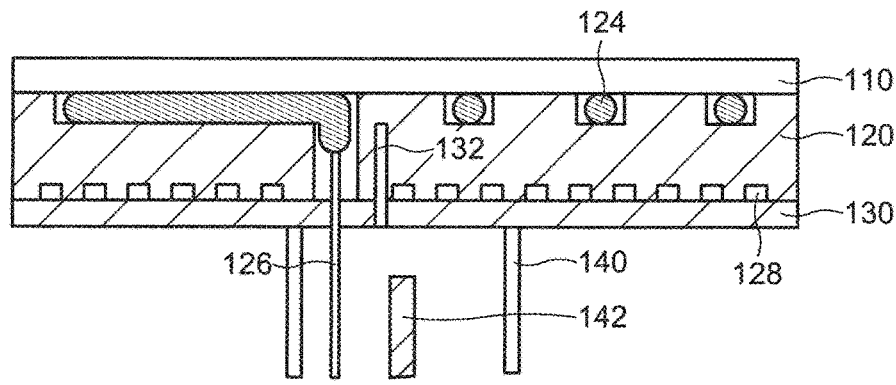
FIG. 7A is a schematic cross-sectional view of a stage according to an embodiment of the present invention.

The structure of the stage 100 is not limited to the aforementioned structure, and a variety of structures may be employed. For example, a trench (channel) 128 for circulating a fluid may be formed on a lower surface of the first supporting plate as shown in FIG. 7A. In this case, a third supporting plate 130 for covering the channel 128 is provided to the stage 100, and the gas for cooling is blown to the first supporting plate 120 through the third supporting plate. The third supporting plate may include a metal usable for the first supporting plate 120 and the second supporting plate 110. The third supporting plate 130 is fixed to the first supporting plate by welding, screw bonding, or brazing. Although not illustrated, the channel 128 may be formed in the third supporting plate 130 without forming the channel 128 in the first supporting plate 120. The temperature of the substrate can be more precisely controlled by flowing a fluid with a temperature controlled by the temperature controller 226 in the channel 128. The fluid may be used in both cases of cooling and heating the stage 100. A liquid medium such as water, an alcohol such as isopropanol and ethylene glycol, silicon oil, and a fluorine-based fluid such as a fluorocarbon may be used as the fluid.

In addition, one or a plurality of openings 132 may be formed in the first supporting plate 120 and the third supporting plate 130 for arranging a temperature sensor. A thermocouple or the like may be utilized as a temperature sensor.

Figure 7B:
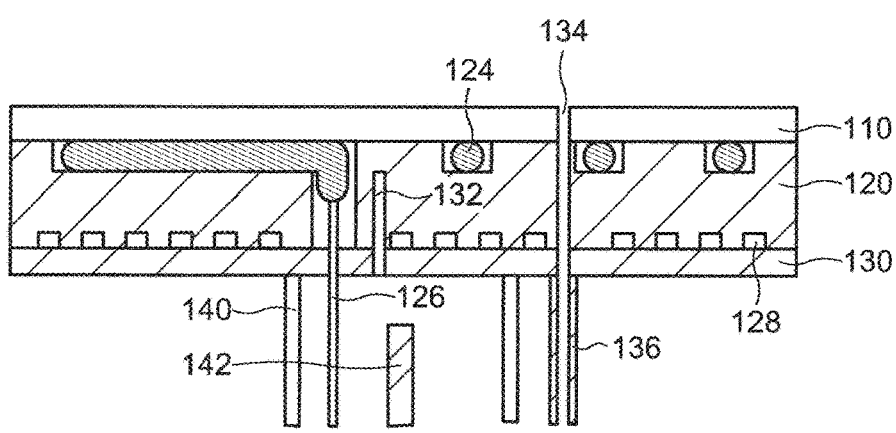
FIG. 7B is a schematic cross-sectional view of a stage according to an embodiment of the present invention.

Alternatively, one or a plurality of through holes 134 passing through the first supporting plate 120, the second supporting plate 110, and the third supporting plate 130 may be provided as shown in FIG. 7B. A source of a gas having a high thermal conductivity such as helium is connected to the through hole 134 via a gas-supplying tube 136. This structure allows a gas having a high thermal conductivity to flow in a gap between the second supporting plate 110 and the substrate, thereby efficiently transferring the thermal energy of the sheath heater 124 to the substrate. Note that the through hole 134 may be formed so as to overlap the shaft 140 or may be formed in a region which does not overlap the shaft 140 as shown in FIG. 7B. It is possible to prevent the gas for cooling from leaking from the through hole 134 and diffusing into the chamber 202 and to secure a large space for arranging the wiring 126 and the gas-supplying tube 142 in the shaft 140 by forming the through hole 134 so as not to overlap the shaft 140.

Figure 7C:
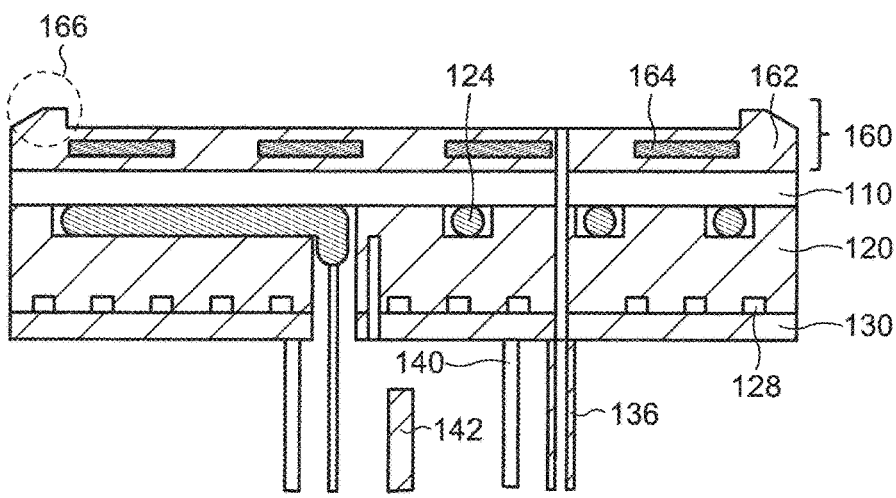
FIG. 7C is a schematic cross-sectional view of a stage according to an embodiment of the present invention.

Alternatively, an electrostatic chuck 160 as a mechanism to fix the substrate over the stage 100 may be provided over the first supporting plate as shown in FIG. 7C. The electrostatic chuck 160 may have a structure in which an electrostatic chuck electrode 164 is covered with an insulating film 162. The substrate can be fixed with the Coulomb force between the charge formed in the electrostatic chuck electrode 164 by applying a high voltage (several hundred volts to several thousand volts) from the power source 244 for an electrostatic chuck (see FIG. 1) to the electrostatic chuck electrode 164 and the charge generated on the back surface of the substrate and having the opposite polarity to the charge generated on the electrostatic chuck electrode 164. Ceramics such as aluminum oxide, aluminum nitrate, and boron nitride may be used as an insulator. Note that it is not always necessary for the insulating film 162 to completely have an insulating property, and the insulating film 162 may have a certain degree of conductivity (e.g., resistivity in the order of $10^9$ $\Omega \cdot cm$ to $10^{12}$ $\Omega \cdot cm$). In this case, the aforementioned ceramics are doped with a metal oxide such as titanium oxide, zirconium oxide, and hafnium oxide in the film 162. A rib 166 for determining the position of the substrate may be provided at a circumference of the electrostatic chuck 160.

As described above, the gas for cooling is supplied from the gas-supplying tube 142 arranged in the shaft 140 to the center portion of the first supporting plate 120 in the stage 100 according to the present embodiment so that the temperatures of the center portions of the first supporting plate 120 and the second supporting plate 110 are lower than the temperatures of their circumference portions. Accordingly, a good balance is established between the input of heat from the sheath heater 124 and the heat dissipation from the circumference portions, allowing the entire first supporting plate 120 and the second supporting plate 110 to have a uniform temperature, by which the temperature of the whole of the substrate can be uniformly controlled.

Second Embodiment

Figure 8:
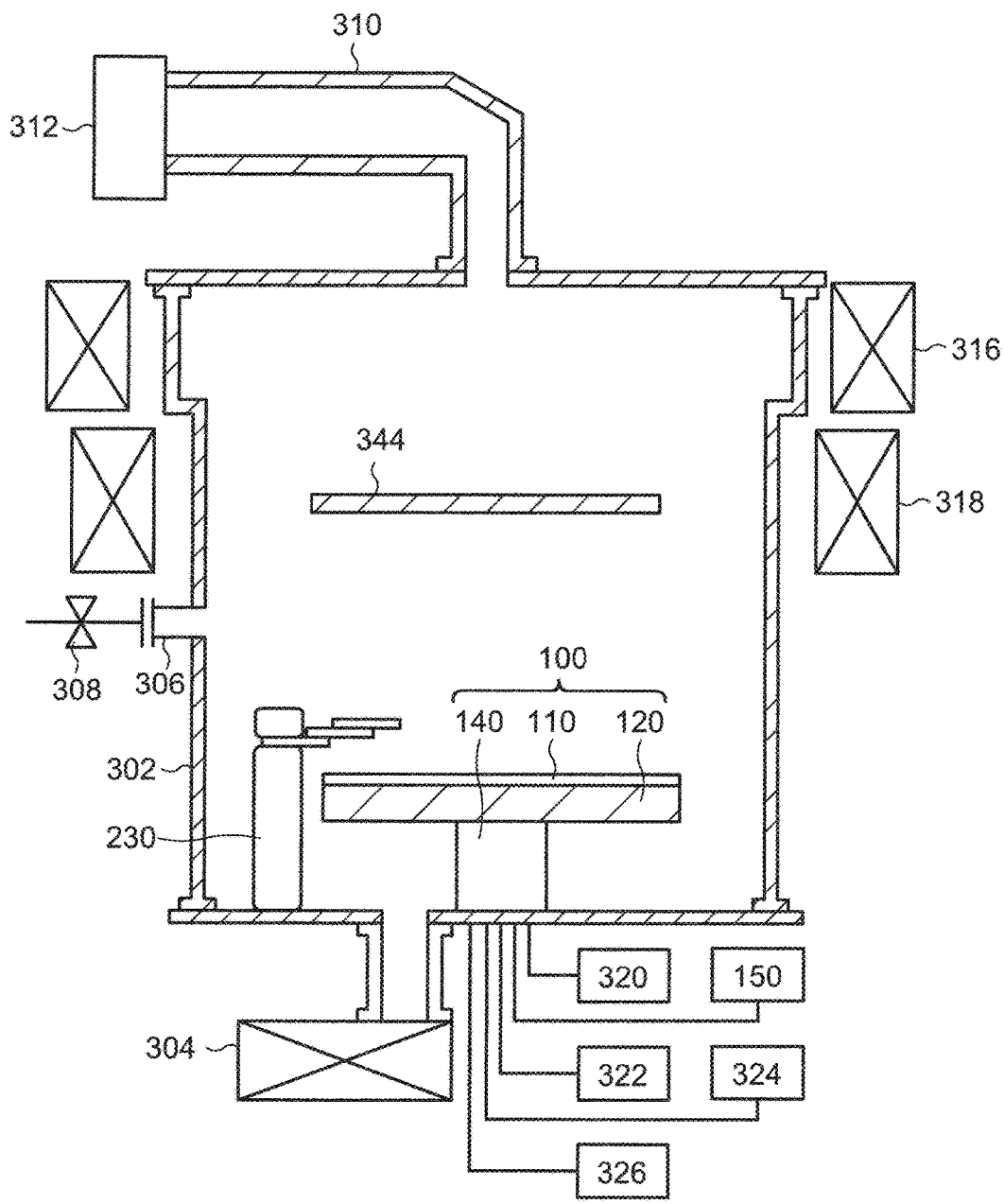
FIG. 8 is a schematic cross-sectional view of a film-forming apparatus according to an embodiment of the present invention.
Figure 9:
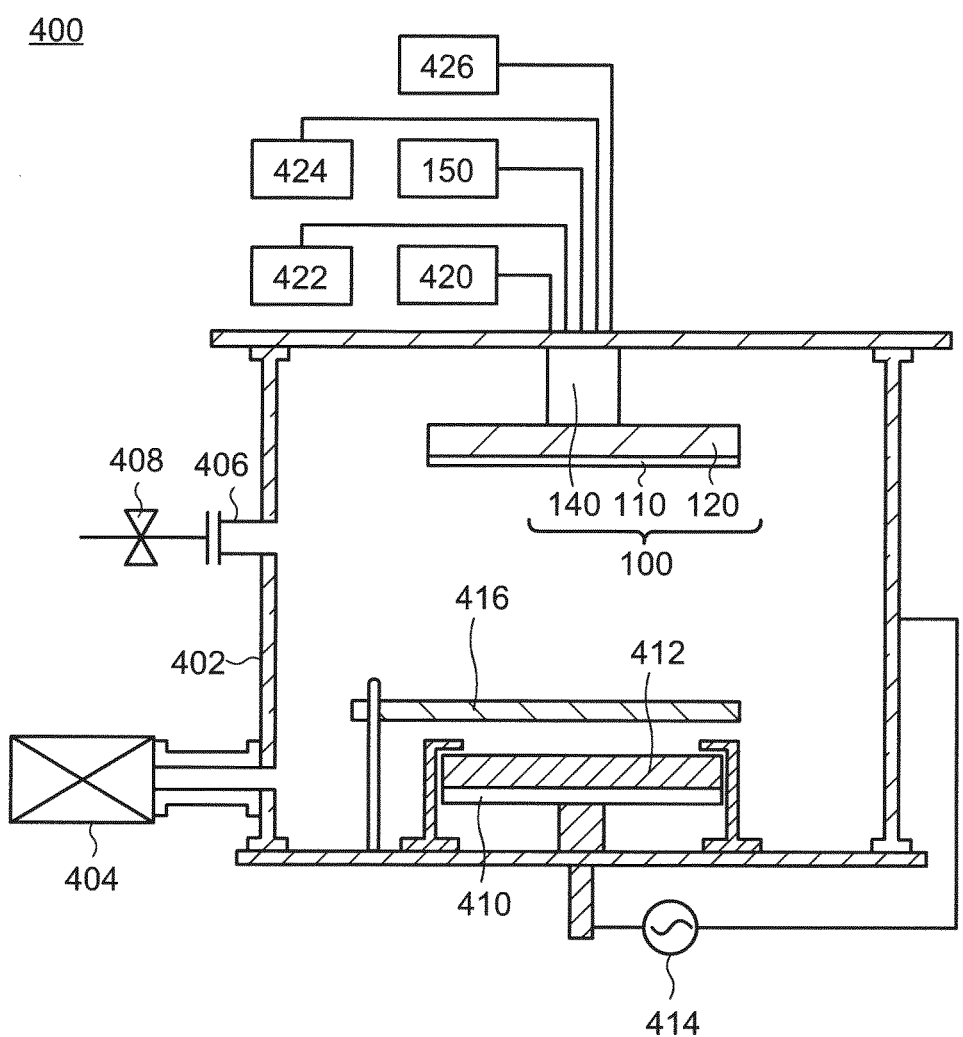
FIG. 9 is a schematic cross-sectional view of a film-forming apparatus according to an embodiment of the present invention.
Figure 10:
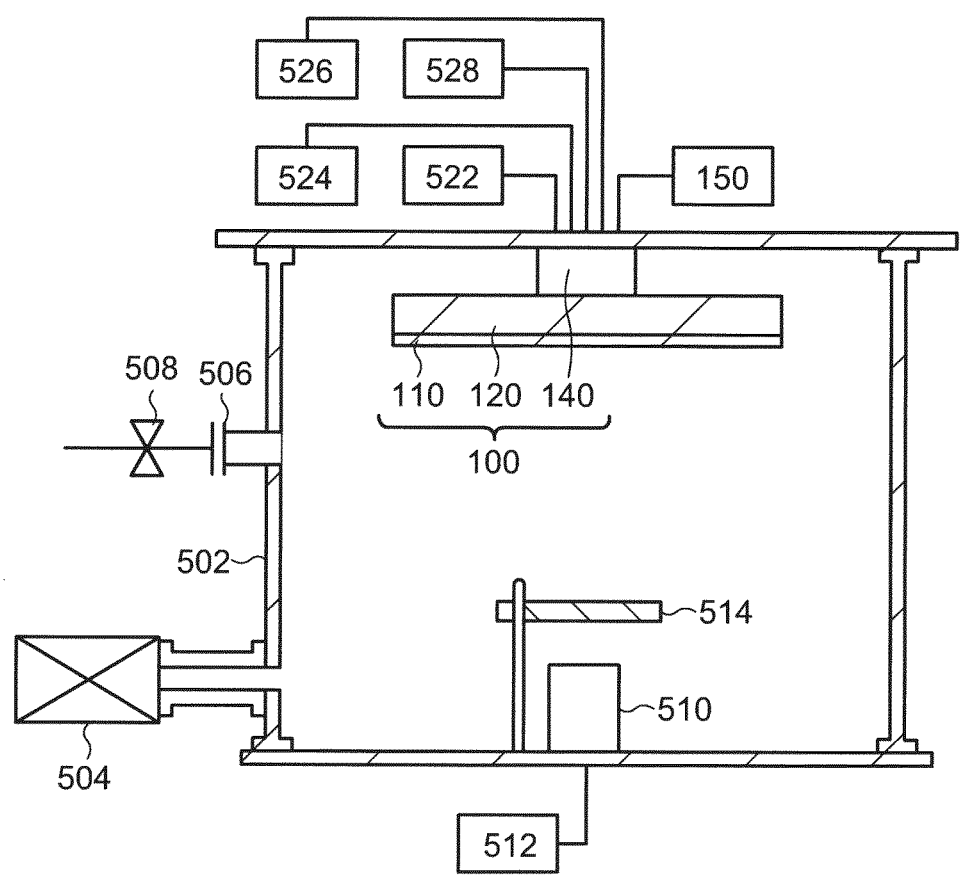
FIG. 10 is a schematic cross-sectional view of a film-forming apparatus according to an embodiment of the present invention.

In the present embodiment, a variety of film-forming apparatus having the stage 100 described in the First Embodiment is explained using FIG. 8 to FIG. 10. Descriptions of the structures the same as those of the First Embodiment may be omitted.

1. CVD Apparatus

FIG. 8 is a schematic view of a CVD apparatus 300 serving as a film-forming apparatus. The CVD apparatus 300 includes a chamber 302 supplying a space for chemically reacting a reaction gas.

An exhaust device 304 is connected to the chamber 302 by which the pressure in the chamber 302 can be reduced. The chamber 302 is further provided with an inlet tube 306 for introducing the reaction gas, and the reaction gas for film formation is introduced into the chamber 302 through a valve 308. A variety of gases may be used as the reaction gas depending on the film to be formed. The gas may be a liquid at a normal temperature. For example, the use of silane, dichlorosilane, tetraethoxysilane, or the like allows the formation of a thin film of silicon, silicon oxide, silicon nitride, or the like. Alternatively, a thin film of a metal such as tungsten and aluminum can be formed by using tungsten fluoride, trimethyl aluminum, and the like.

Similar to the etching apparatus 200, a microwave source 312 may be disposed at an upper portion of the chamber 302 through a waveguide tube 310. The microwaves generated by the microwave source 312 are introduced into the chamber 302 by the waveguide tube 310. The reaction gas is converted to a plasma with the microwaves, and the chemical reactions of the gas are promoted by a variety of active species included in the plasma, by which products obtained by the chemical reactions are deposited over a substrate to provide a thin film. A magnet 344 may be disposed as an optional component in the chamber 302 for increasing the plasma density. The stage 100 described in the First Embodiment is arranged at a lower portion of the chamber 302, by which deposition of thin films can be performed in a state where the substrate is disposed over the stage 100. Similar to the etching apparatus 200, magnets 316 and 318 may be arranged on a side surface of the chamber 302.

A power source 320 for supplying high-frequency electric power to the stage 100, a heater power source 322 for controlling the sheath heater 124, a power source 324 for the electrostatic chuck, and a temperature controller 326 for controlling the temperature of the fluid circulated in the stage 100 may be connected to the stage 100. A rotation-controlling device (not illustrated) for rotating the stage 100 may be provided to the CVD apparatus 300 as an optional component.

2. Sputtering Apparatus

FIG. 9 is a schematic view of a sputtering apparatus 400 as one of the film-forming apparatuses. The sputtering apparatus has a chamber 402 to supply a space for collision of high-speed ions with a target and deposition of the target atoms formed by the collision.

An exhaust device 400 for reducing the pressure in the chamber 402 is connected to the chamber 402. An inlet tube 406 and a valve 408 for introducing a sputtering gas such as argon to the chamber 402 is provided to the chamber 402.

A target stage 410 supporting a target including a material subjected to the film formation and serving as a cathode is arranged at a lower portion of the chamber 402, over which the target 412 is disposed. A high-frequency power source 414 is connected to the target stage 410, and plasma can be formed in the chamber 402 by the high-frequency power source 414.

The stage 100 described in the First Embodiment can be disposed at an upper portion of the chamber 402. In this case, thin-film formation proceeds in a state where the substrate is arranged under the stage 100. Similar to the etching apparatus 200 and the CVD apparatus 300, a power source 420 for supplying high-frequency electric power to the stage 100, a heater power source 422, a power source 424 for an electrostatic chuck, and a temperature controller 426 may by connected to the stage 100. A rotation-controlling device (not illustrated) for rotating the stage 100 may be installed in the sputtering device 400 as an optional component.

Argon ions accelerated by the plasma generated in the chamber 402 collide with the target 412, and the atoms of the target 412 are sputtered. The sputtered atoms fly to the substrate and are deposited over the substrate arranged under the stage 100 while a shutter 416 is opened.

A structure is exemplified in the present embodiment in which the stage 100 and the target stage 410 are respectively arranged at the upper and lower portions of the chamber 402. However, the present embodiment is not limited to this structure, and the sputtering apparatus 400 may be configured so that the target is located over the stage 100. Alternatively, the target stage 410 may be provided so that a main surface of the substrate is arranged perpendicularly to the horizontal plane and that the target stage 410 is disposed to oppose thereto.

3. Evaporation Apparatus

FIG. 10 is a schematic view of an evaporation apparatus 500 as one of the film-forming apparatus. The evaporation apparatus 500 has a chamber 502 to supply a space for evaporating a material in an evaporation source 510 and depositing the evaporated material over a substrate.

An exhaust device 504 for creating a high vacuum in the chamber 502 is connected to the chamber 502. An inlet tube 506 for retrieving an atmospheric pressure in the chamber 502 is provided to the chamber 502, and an inert gas such as nitrogen and argon is introduced to the chamber 502 via a valve 508.

The stage 100 described in the First Embodiment may be disposed at an upper portion of the chamber 502. Deposition of a material proceeds in a state where the substrate is arranged under the stage 100. Similar to the etching apparatus 200, the CVD apparatus 300, the sputtering apparatus 400, a heater power source 522, a power source 524 for an electrostatic chuck, and a temperature controller 526 may be connected to the stage 100. A rotation-controlling device 528 for rotating the stage 100 may also be provided as an optional component. Although not illustrated, the stage 100 may further have a mask holder for fixing a metal mask between the substrate and the evaporation source 510, by which the metal mask can be arranged at a vicinity of the substrate so that opening portions of the metal mask overlap with the regions for depositing the material.

The evaporation source 510 is disposed at a lower portion of the chamber 502, and the material to be evaporated is charged in the evaporation source 510. A heater is provided to the evaporation source 510 for heating the material and is controlled with a controlling device 510. The inside of the chamber 502 is set to a highly vacuum state with the exhaust device 504, and the material is vaporized by heating the evaporation source 510 so that the evaporation starts. The deposition of the material starts on the substrate by opening a shutter 514 when the evaporation rate becomes constant.

As described above, the film-forming apparatus such as the CVD apparatus 300, the sputtering apparatus 400, and the evaporation source according to the present embodiment may include the stage 100 explained in the First Embodiment. Hence, the temperature of the substrate can be precisely controlled and adjusted with high responsiveness, which facilitates the control of the physical properties of the thin films to be produced.

EXAMPLE

In this example, the results for measuring a temperature profile of the stage 100 described in the First Embodiment are described.

Figure 11:
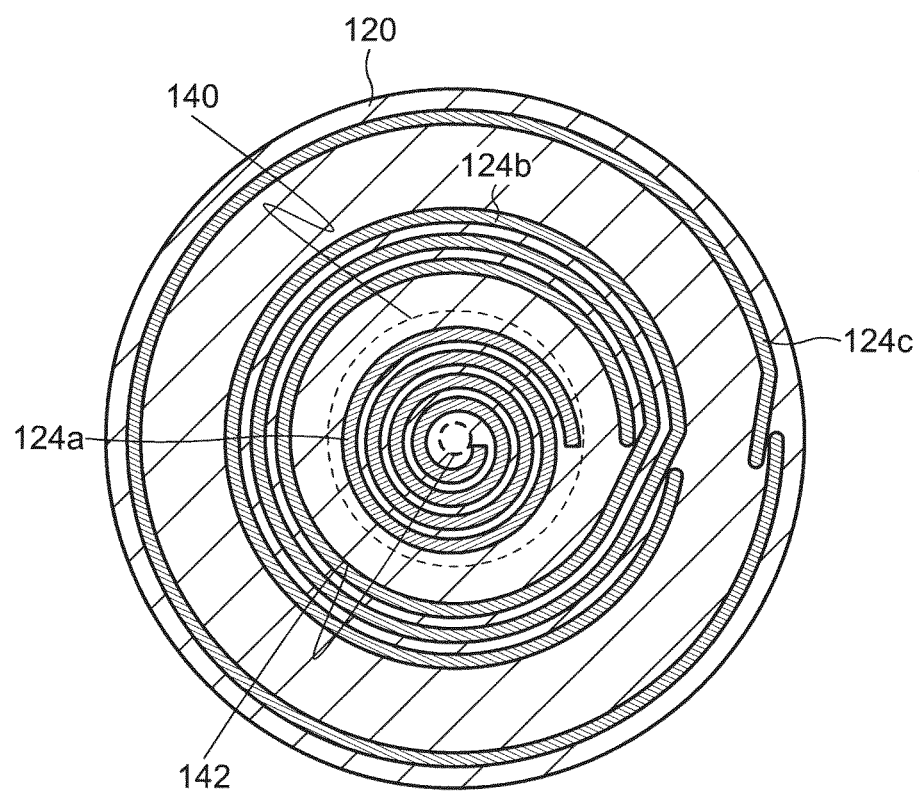
FIG. 11 is a schematic top view of a stage in the example.

In this Example, the stage 100 (see FIG. 2A) including the first supporting plate 120 and the second supporting plate 110 made of aluminum was used. As shown in FIG. 11, three sheath heaters (first sheath heater 124a, a second sheath heater 124b, and a third sheath heater 124c (each have an outer diameter of 310 mm and a capacitance of 1200 W)) were arranged in the first supporting plate 120. The first sheath heater 124a was arranged so as to overlap the shaft 140 and surround a region overlapping the gas-supplying tube 142 several times. The second sheath heater 124b wound approximately three times to surround the first heater 124a was arranged. The third sheath heater 124c was arranged closest to the circumference portion of the first supporting plate 120. A total thickness of the first supporting plate 120 and the second supporting plate 110 was 33 mm, and the diameters thereof were each 322 mm. Three thermocouples were arranged in the first supporting plate 120 and the second supporting plate 110, and heating was carried out by applying a current to these three sheath heaters 124. The heating was carried out to apply a current to each sheath heater 124 using a power source of 200 V and 10 A so that the temperature increases to a predetermined temperature under the PID control. Air at room temperature was used as the gas for cooling and supplied to the center portion of the first supporting plate 120 via the gas-supplying tube 142 at a flow rate of 100 L/min.

Figure 12A:
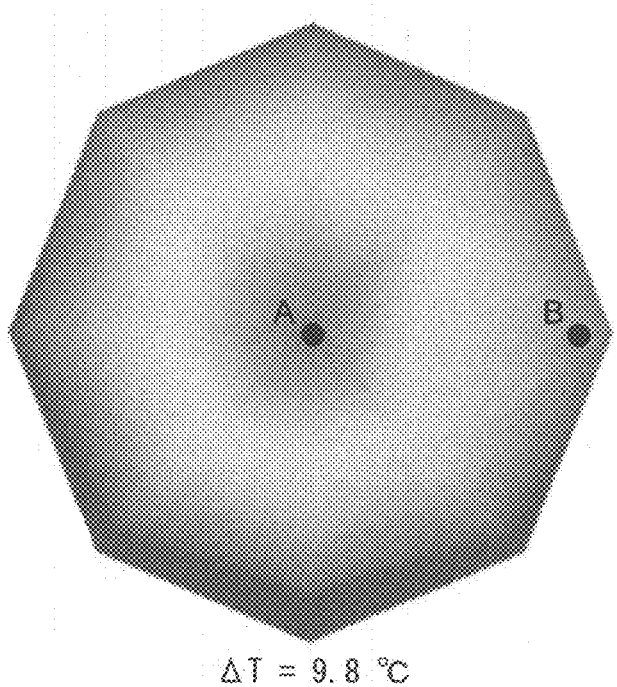
FIG. 12A is a temperature distribution of a first supporting plate in the example.

The heating was carried out in a state where a dummy wafer was disposed on a surface of the second supporting plate 110, and then temperatures were measured at 17 points after the temperature reached a steady state. A drawing schematically representing the temperature distribution is illustrated in FIG. 12A on the basis of the results. As can be understood from FIG. 12A, the temperature at the center portion of the second supporting plate 110 is lower than that of the circumference portion thereof. Specifically, the temperatures of the center portion A and the circumference portion B were 145.2° C. and 155° C., respectively, and the difference therebetween was 9.8° C.

Figure 12B:
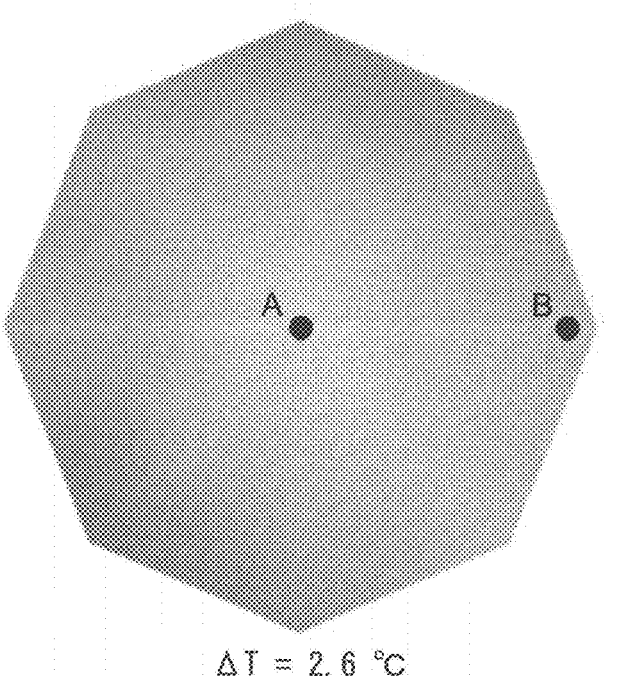
FIG. 12B is a temperature distribution of a first supporting plate in the comparable example.

A schematic drawing of the temperature distribution obtained by conducting a similar experiment without supplying the gas for cooling is shown in FIG. 12B. As can be understood from this drawing, the temperature was uniform across the second supporting plate 110 in the case where the gas for cooling was not supplied. The temperatures of the center portion A and the circumference portion B were 152.4° C. and 155° C., respectively, and the difference therebetween was 2.6° C.

From these results, it has been proven that the temperatures of the center portions of the first supporting plate 120 and the second supporting plate 110 can be set to be lower than the temperature of the circumference portion by supplying the gas for cooling in the stage 100 according to one of the embodiments. When the stage 100 is used in a film-forming apparatus and a film-processing apparatus, heat dissipation occurs from the circumference portion. Hence, it was confirmed that the use of the stage 100 according to one of the embodiments realizes an ideal temperature profile and allows the temperature of a substrate to be uniformly controlled across the substrate.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

It is understood that another effect different from that provided by the modes of the aforementioned embodiments is achieved by the present invention if the effect is obvious from the description in the specification or readily conceived by persons ordinarily skilled in the art.

What is claimed is:

1. A stage comprising:
   a shaft;
   a first supporting plate over the shaft;
   a heater arranged in a trench formed in the first supporting plate; and
   a gas-supplying tube arranged in the shaft and configured to blow a gas to the first supporting plate,
   wherein a tip of the gas-supplying tube is spaced in an extending direction of the gas-supplying tube from an end of the shaft over which the first supporting plate is positioned, and is located under the end of the shaft.

2. The stage according to claim 1,
   wherein the first supporting plate has a disk shape, and
   wherein a cross section of the gas-supplying tube parallel to a surface of the first supporting plate overlaps a center of the disk shape.

3. The stage according to claim 1,
   wherein the first supporting plate is configured to block the gas and not to release the gas into a chamber in which the stage is arranged.

4. The stage according to claim 1, further comprising a second supporting plate over the first supporting plate.

5. The stage according to claim 1, further comprising a third supporting plate under the first supporting plate,
   wherein the first supporting plate has a channel for circulating a fluid.

6. The stage according to claim 1,
   wherein the first plate has a through hole which does not overlap the shaft.

7. The stage according to claim 1, further comprising a plurality of gas-discharging tubes surrounding the gas-supplying tube.

8. A method for controlling a substrate temperature, the method comprising:
   arranging a substrate over a first stage comprising a first supporting plate and a shaft under the first supporting plate;

heating the first stage with a heater arranged in a trench formed in the first supporting plate; and blowing a gas to the first supporting plate from a gas-supplying tube arranged in the shaft, wherein a tip of the gas-supplying tube is spaced in an extending direction of the gas- supplying tube from an end of the shaft over which the first supporting plate is positioned, and is located under the end of the shaft.

9. The method according to claim 8, wherein the first supporting plate has a disk shape, and wherein the gas is blown so that a temperature of a center of the first supporting plate is lower than a temperature of a circumference portion of the first supporting plate.

10. The method according to claim 8, wherein the first supporting plate has a disk shape, and wherein the gas-supplying tube is arranged so that a cross section of the gas-supplying tube parallel to a surface of the first supporting plate overlaps a center of the disk shape.

11. The method according to claim 8, further comprising discharging the gas to the outside of a chamber in which the stage is arranged so that the gas is not released into the chamber.

12. The method according to claim 8, further comprising flowing a fluid in a channel formed in the first supporting plate.

\* \* \* \* \*